United States Patent
Sivaramakrishnan et al.

[11] Patent Number: 5,968,588
[45] Date of Patent: Oct. 19, 1999

[54] IN-SITU LIQUID FLOW RATE ESTIMATION AND VERIFICATION BY SONIC FLOW METHOD

[75] Inventors: Visweswaren Sivaramakrishnan, Santa Clara; Yen-Kun Wang, Fremont; Fong Chang, Los Gatos; Thanh Pham, San Jose; Jeff Plante, Pleasanton, all of Calif.

[73] Assignee: Applied Materials, Inc., Santa Clara, Calif.

[21] Appl. No.: 08/819,674

[22] Filed: Mar. 17, 1997

[51] Int. Cl.$^6$ .................................................... C23C 16/00
[52] U.S. Cl. ........................ 427/8; 427/248.1; 118/696; 118/708; 118/712; 118/715; 118/726
[58] Field of Search ..................... 118/715, 726, 118/696, 708, 712; 427/8, 248.1

[56] References Cited

U.S. PATENT DOCUMENTS 5,419,924 5/1995 Nagashima et al. .................. 427/248.1
5,520,969 5/1996 Nishizato et al. ........................... 427/8

Primary Examiner—Richard Bueker
Attorney, Agent, or Firm—Arnold, White & Durkee

[57] ABSTRACT

An apparatus for in-situ control of the flow of a liquid precursor into a deposition chamber comprises a liquid injection system having a liquid injection outlet connected to a chamber inlet line upstream of the deposition chamber. The liquid injection system includes a liquid precursor supply, a carrier gas supply, a vaporizer, and a controller managing flows of the liquid precursor and carrier gas to the chamber. A bypass line is connected to the chamber inlet line and includes a bypass valve, a sonic orifice, and a pressure gauge upstream of the sonic orifice. To calibrate the flow of the liquid precursor, a flow of carrier gas is directed into the bypass line at a carrier gas sonic flow rate. A first steady state pressure is measured with the pressure gauge. The liquid precursor is vaporized and directed to the flow of carrier gas into the bypass line. A second steady state pressure is measured with the pressure gauge. Calibration information is computed using the first steady state pressure and second steady state pressure based on sonic flow theory. The calibration information is used to calibrate the controller to correct deviations in the liquid flow rate and achieve a target liquid precursor flow rate for improving wafer uniformity.

33 Claims, 3 Drawing Sheets

IN-SITU LIQUID FLOW RATE ESTIMATION AND VERIFICATION BY SONIC FLOW METHOD

FIELD OF THE INVENTION

This invention relates generally to the control of the flow of a liquid precursor into a process chamber for semiconductor processing, and more particularly to in-situ estimation and verification of a fluid control system using a sonic flow method.

BACKGROUND OF THE INVENTION

In a wafer fabrication process, a wafer is commonly subjected to process gases under pressure in the controlled environment of a process chamber. The deposition formation rate on the wafer and the etching removal rate from the wafer depend on the input gas flow rate of the process gases that enter the process chamber encapsulating the wafer.

A vapor deposition system for wafer fabrication generally includes a liquid delivery or injection system for vaporizing a liquid chemical and carrying the vaporized liquid into the deposition process or reaction chamber for wafer processing. A typical liquid delivery system for a chemical vapor deposition process manages the flow of a liquid precursor or reagent, a carrier gas, and one or more other process gases. The liquid precursor is delivered to a vaporization device at a steady flow rate. The carrier gas is delivered to the vaporization device for mixing with the vaporized liquid precursor. The other process gases are combined with the mixture of the vaporized liquid precursor and carrier gas for delivery to the process chamber.

A critical factor in the production of wafers with superior uniformity is the precise control of the flow rate of the delivery of the liquid precursor into the process chamber. Irregularities in the flow rate may cause nonuniformity and erroneous deposition film thickness that adversely affect wafer quality and acceptability. The liquid precursor flow rate is typically generated by a liquid mass flow controller that is governed electronically by a voltage signal, such as that produced in a liquid flow meter. The accuracy of the flow rate produced by the liquid mass flow controller depends on the calibration between the voltage signal and the actual flow rate delivered. Factory calibration of the liquid delivery system is generally approximate with a typical tolerance of up to 10%. Therefore, an in-situ flow rate adjustment technique is necessary to compensate for the imprecise factory calibration and to improve wafer uniformity and obtain proper deposition film thickness.

An in-situ estimation and verification methodology in U.S. Pat. No. 5,520,969 utilizes the steady state pressure differentials observed in the process chamber to compute a correction constant for controlling the mass flow rate of the liquid precursor. The steady state pressure differentials are obtained from a first pressure rise due to a flow of a carrier gas through the chamber and a second pressure rise resulting from a flow of the carrier gas injected with the liquid precursor through the chamber.

Although the '969 patent offers a steady state methodology that is relatively simple and accurate compared to prior techniques that are based on measurements of transient parameters, the approach may produce undesirable effects in the processing system. For instance, the process chamber may be contaminated by the gases (e.g., TEPO) used in the in-situ estimation and verification process, and the contamination may adversely affect the deposition process. In addition, pressure sensors and flow control valves connected to the chamber for gas flow measurement and control may have defects or leaks that contribute to processing errors during deposition.

SUMMARY OF THE INVENTION

There is therefore a need for an accurate and reliable in-situ estimation and verification methodology that overcomes the disadvantages of the prior art.

It is a feature of this invention to provide accurate and reliable in-situ estimation and verification without the need to flow gases into the process chamber and the need for the pressure sensors and chamber pressure control valves connected to the chamber.

It is another feature of the invention to utilize steady state pressures that can be more easily and accurately measured than transient parameters.

It is yet another feature of the present invention to automate the in-situ estimation and verification methodology.

In accordance with one aspect of the present invention, an apparatus for in-situ control of the flow of a liquid precursor into a deposition chamber comprises a liquid injection system which has a liquid precursor supply, a carrier gas supply, a liquid injection outlet, a vaporizer, and a controller. The controller manages flows of the liquid precursor and the carrier gas to the liquid injection outlet. A chamber inlet line is disposed upstream of the deposition chamber and connected between the liquid injection outlet and the deposition chamber. A bypass line is connected to the chamber inlet line at a bypass inlet. The bypass line is downstream of the bypass inlet, and includes a bypass valve, a sonic orifice, and a pressure gauge upstream of the sonic orifice.

Another aspect of the invention is a method utilizing the apparatus for in-situ control of the flow of a liquid precursor. The method comprises the steps of directing a flow of carrier gas into the bypass line at a carrier gas sonic flow rate and measuring a first steady state pressure with the pressure gauge. The liquid precursor is vaporized and directed to the flow of carrier gas into the bypass line, and a second steady state pressure is measured with the pressure gauge. Calibration information is computed using the first steady state pressure and the second steady state pressure. The controller is calibrated using the calibration information to achieve a target flow rate of the liquid precursor.

Another aspect of this invention is a method for in-situ control of the flow of a liquid precursor into a deposition process chamber. The method comprises the steps of flowing a sonic flow of carrier gas across a high pressure-drop site of a bypass line which is connected to an inlet line to a chamber at a location upstream of the chamber. A first steady state pressure of the bypass line upstream of the high pressure-drop site is measured. The method flows a vaporized liquid precursor into the sonic flow of carrier gas for delivery into the bypass line at a liquid precursor flow rate and measures a second steady state pressure of the bypass line upstream of the high pressure-drop site. Control data is generated from the first steady state pressure and second steady state pressure. The liquid precursor flow rate is controlled to achieve an intended liquid flow rate in response to the control data.

In accordance with yet another aspect of the present invention, an apparatus for in-situ control of the flow of a liquid precursor into a vapor deposition chamber comprises a chamber inlet line in communication with a vapor deposition chamber. A bypass line is in communication with the chamber inlet line and comprises a sonic restriction and a pressure measurement device upstream of the sonic restriction. A carrier gas supply is in communication with the chamber inlet line and upstream of the bypass line. The apparatus further comprises a liquid precursor vaporizer and a means for controlling a flow of liquid precursor into the chamber inlet line at a location downstream of the carrier gas supply and upstream of the bypass line.

BRIEF DESCRIPTION OF THE DRAWINGS

The preferred embodiments of this invention, illustrating all their features, will now be discussed in detail. These embodiments depict the novel and nonobvious in-situ liquid flow rate estimation and verification apparatus and method of this invention shown in the accompanying drawings, which are included for illustrative purposes only. These drawings include the following figures, with like numerals indicating like parts.

DETAILED DESCRIPTION OF THE INVENTION

The present invention employs a sonic flow approach to provide a method and an apparatus for in-situ liquid flow rate estimation and verification. The sonic flow approach is illustrated in terms of a chemical vapor deposition system but may be applied to other environments for in-situ liquid flow rate estimation and verification.

A. Sonic Flow Control Wafer Processing Apparatus

Figure 1:
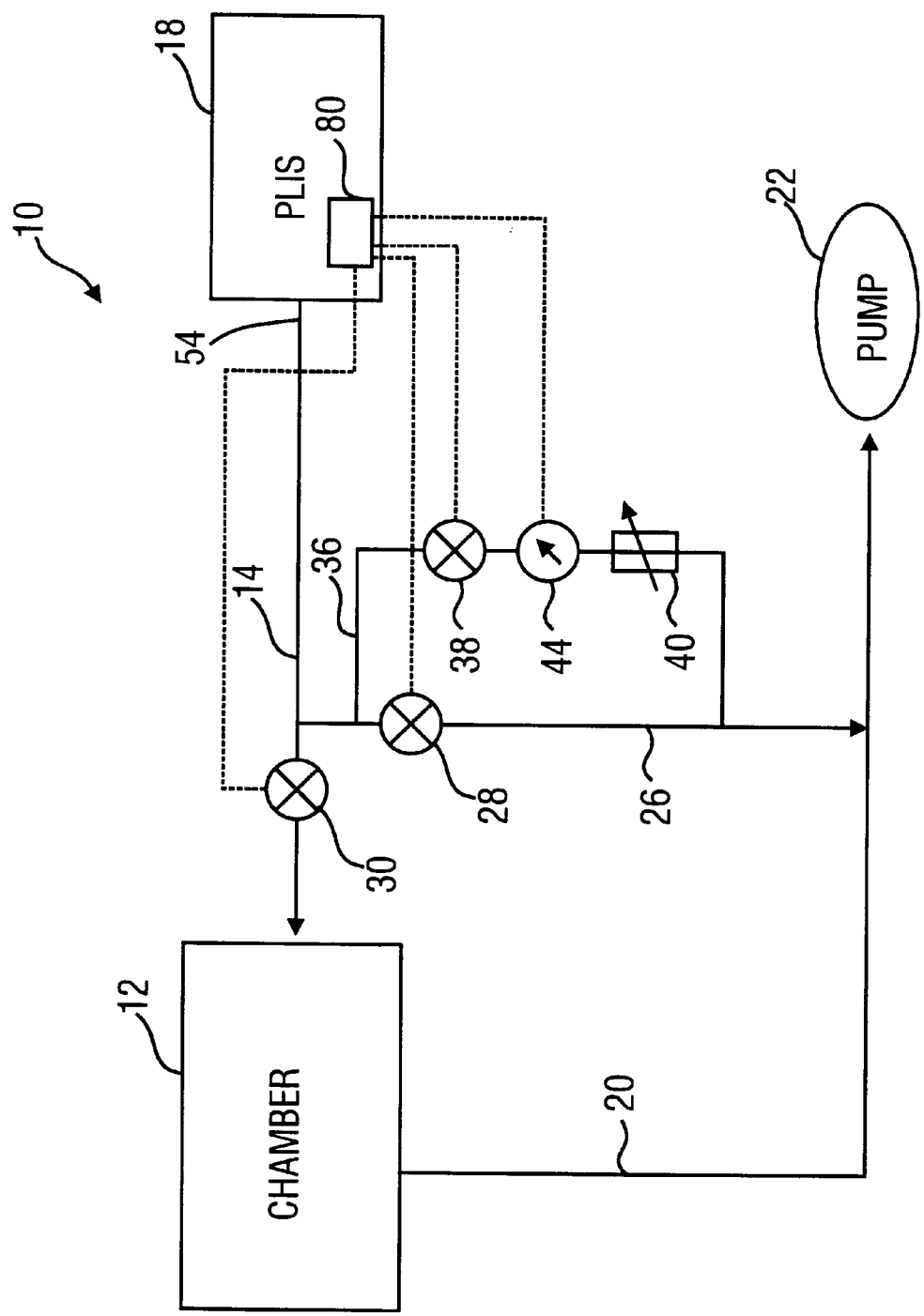
FIG. 1 is a schematic view illustrating a semiconductor wafer processing system of the present invention.

FIG. 1 shows a semiconductor wafer processing system 10 which includes a process chamber 12 that houses wafers (not shown). A chamber inlet line 14 supplies input gases produced from a liquid injection system 18 into the chamber 12. The chamber 12 releases the gases through a chamber outlet line 20 connected to a pump 22, which is desirably a vacuum pump that evacuates the chamber 12 and relieve chamber pressure during processing. A bypass line 26 desirably connects between the chamber inlet line 14 and the chamber outlet line 20 for bypassing the input gases when desired. A bypass valve 28 is desirably disposed along the bypass line 26. A chamber inlet valve 30 is advantageously disposed in the chamber inlet line 14 downstream from the location where the bypass line 26 intersects the chamber inlet line 14.

A sonic bypass line 36 is in communication with the bypass line 26 desirably with its inlet connected at a location upstream of the bypass valve 28 and its outlet connected at a location downstream of the bypass valve 28. A sonic bypass valve 38 is disposed along the sonic bypass line 36 upstream of a sonic orifice or restriction 40. The sonic orifice 40 provides flow restriction sufficient to create a high pressure-drop flow referred to as a sonic flow across the sonic orifice 40. In a sonic flow, the pressure downstream of the high pressure-drop site 40 (i.e., the sonic orifice) is lower than half of the pressure upstream of the sonic orifice 40. A pressure measurement device 44 such as a pressure gauge or sensor is desirably located between the sonic bypass valve 38 and the sonic orifice 40.

Figure 2:
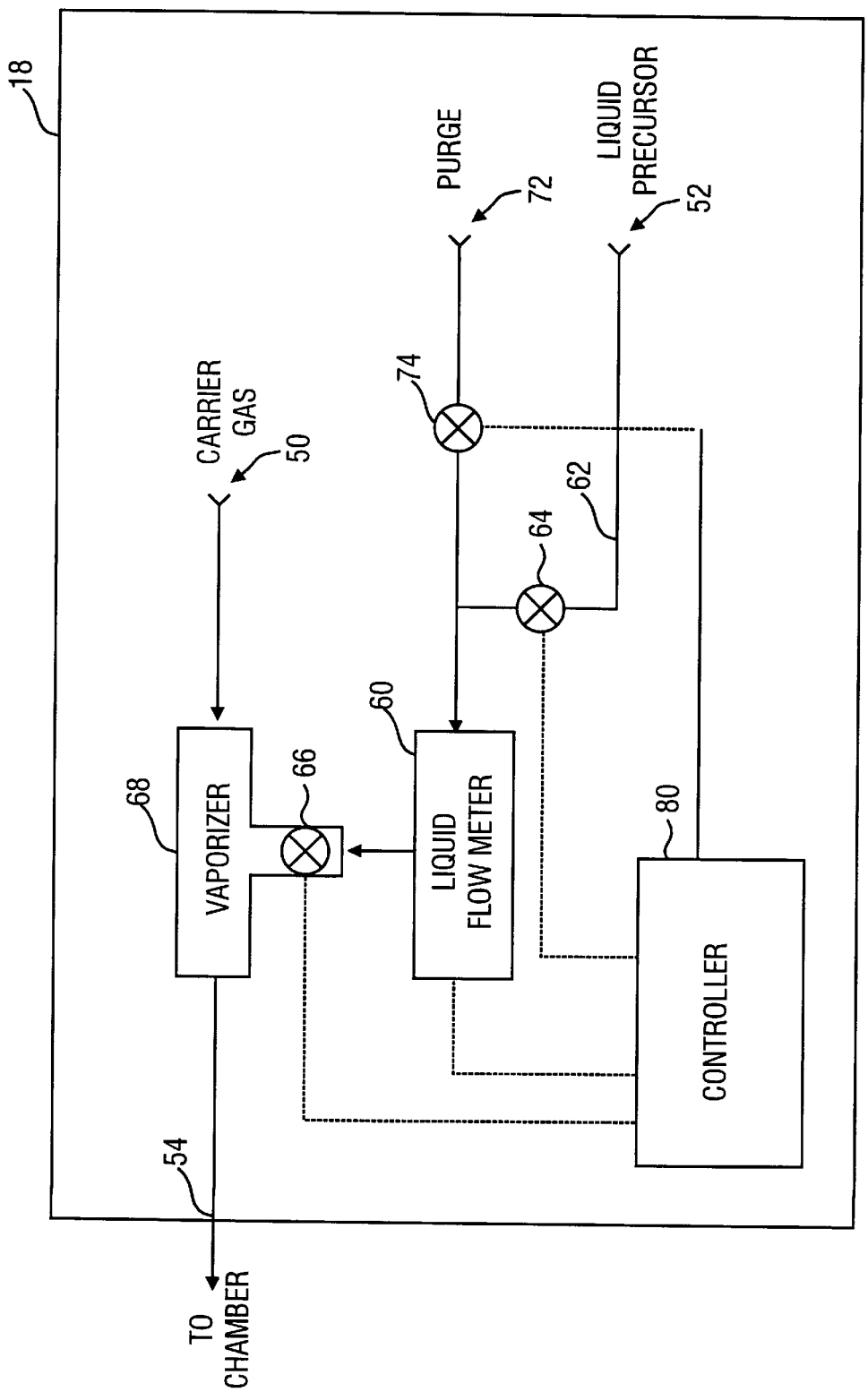
FIG. 2 is a schematic view illustrating a precision liquid injection system of the present invention.

FIG. 2 illustrates the liquid injection system 18, which comprises a carrier gas inlet 50 for supplying carrier gas, a liquid precursor inlet 52 for supplying a liquid precursor or reagent, and a liquid injection outlet or liquid injection system outlet 54 in communication with the chamber inlet line 14. The liquid precursor inlet 52 is desirably in communication with a liquid flow meter 60 through a liquid precursor inlet line 62 with a liquid precursor inlet valve 64 disposed therebetween. The liquid flow meter 60 preferably feeds the liquid precursor through an injection control valve 66 to a vaporizer 68, which also receives the carrier gas from the carrier gas inlet 50 and communicates with the liquid injection system outlet 54. The injection control valve 66 is advantageously adjustable to vary the flow rate of the liquid precursor into the vaporizer 68. The liquid flow meter 60 serves dual purposes: it may be set at a desirable target liquid flow rate and also measures the liquid flow rate passing therethrough. A purge inlet 72 with a purge valve 74 may also be provided to communicates with the liquid flow meter 60 to supply a purge gas such as nitrogen for purging the processing system 10.

A controller 80 is advantageously provided to manage the flow circuit of the processing system 10. The controller 80 may be any suitable flow regulating device that advantageously includes a processor such as a computer processor for generating, receiving, and processing the signals automatically (not shown). The controller 80 desirably communicates with the chamber inlet valve 30, bypass valve 28, and sonic bypass valve 38 to manage the direction of the gas flow from the liquid injection system outlet 54 by sending signals such as voltages to the valves. The controller 80 communicates with the pressure gauge 44 of the sonic bypass line 36 to receive pressure signals detected in the pressure gauge 44. The controller 80 desirably also communicates with the purge inlet valve 74, liquid precursor inlet valve 64, and injection control valve 66 to manage the flow of these fluids into the vaporizer 68. The controller 80 may also communicate with the carrier gas, liquid precursor, and purge gas supplies (not shown) to maintain constant flow rates for each fluid.

The controller 80 advantageously communicates with the liquid flow meter 60 to receive the liquid flow meter setting and adjust the injection control valve 66 accordingly to achieve the target liquid flow rate. The controller 80 also receives the liquid flow rate measurement data from the liquid flow meter 60 and adjusts the injection control valve 66 based on the measured data in a feedback loop until the measured liquid flow rate matches the liquid flow meter setting in the liquid flow meter 60.

The components of the processing system 10, including those of the liquid injection system 18, are commercially available with a wide selection and known in the art. For instance, the vaporizer 68 may be of the type that utilizes the carrier gas to vaporize the liquid precursor such as that discussed in U.S. Pat. No. 5,419,924, which is hereby incorporated by reference.

B. Sonic Flow Calibration Methodology

When the sonic orifice 40 has a sufficient restriction to cause a high pressure drop from an upstream pressure ($P_u$) to a downstream pressure ($P_d$) that is less than half of the upstream pressure, a sonic flow occurs in the sonic bypass line 36 across the sonic orifice 40. In a sonic flow, gas flow rate is proportional to the upstream pressure of the orifice 40, $$Q_v + Q_c P_u - P_0, \qquad (1)$$

where $Q_v$ is the vaporized liquid precursor flow rate or vapor precursor flow rate, $Q_c$ is the carrier gas flow rate, and $P_0$ is a base pressure measured in the bypass line 36 prior to the introduction of the carrier gas or the vapor precursor.

Because the vapor precursor flow rate after vaporization is proportional to the liquid precursor flow rate prior to vaporization, the actual or measured liquid precursor flow rate $Q_a$ can be expressed as $$Q_a = KR_a, \qquad (2)$$

where K is a proportional constant and $R_a$ is an actual or measured pressure rise ratio corresponding to the liquid precursor flow rate $Q_a$. $R_a$ is obtained from $$R_a = (P_2 - P_1)/(P_1 - P_0), \qquad (3)$$

where $P_1$ is the first steady state pressure measured in the sonic bypass line 36 upstream of the sonic orifice 40 when the carrier gas is directed into the sonic bypass line 36, $P_2$ is the second steady state pressure measured in the sonic bypass line 36 upstream of the sonic orifice 40 when the vapor precursor is introduced into the carrier gas flow into the sonic bypass line 36.

This measured pressure rise ratio $R_a$ results from the actual liquid precursor flow rate $Q_a$, which may deviate from the intended or expected liquid precursor flow rate $Q_e$ specified in the liquid injection system 18 due to system inaccuracies such as that of the liquid flow meter 60. Thus, $R_a$ will generally deviate from an expected or reference pressure rise ratio $R_e$ which would be obtained for the expected liquid precursor flow rate $Q_e$ if liquid injection system 18 for controlling the liquid precursor flow rate were accurate to produce the precise expected flow rate $Q_e$. $R_e$ can be expressed as $$R_e = (P_{e2} - P_{e1})/(P_{e1} - P_{e0}), \qquad (4)$$

where $P_{e0}$ is the expected or reference base pressure (which is generally the same as $P_0$), $P_{e1}$ is the first expected or reference steady state pressure with a flow of carrier gas into the sonic bypass line 36 (which is generally the same as $P_1$ for the same carrier gas and flow rate), and $P_{e2}$ is the second expected or reference steady state pressure with a flow of a mixture of carrier gas and vapor precursor into the sonic bypass line 36, and $P_{e2}$ are obtained with the expected liquid precursor flow rate $Q_e$. $Q_e$ may be expressed as $$Q_e = KR_e. \qquad (5)$$

The comparison between the two pressure rise ratios produces a correction factor C $$C = R_a/R_e. \qquad (6)$$

C may also be expressed as $$C = Q_a/Q_e. \qquad (7)$$

The correction factor C is used to compensate for the inaccuracies of the liquid injection system 18 which produces an actual pressure rise ratio $R_a$ even though the liquid injection system is set at an intended or expected or reference liquid precursor flow rate $Q_e$. As noted above, the actual measured flow rate in reality is $Q_a$ instead of $Q_e$ due to system inaccuracies. A calibration procedure using the expected liquid precursor flow rate $Q_e$ and avoiding system inaccuracies produces the expected pressure rise ratio $R_e$. The correction factor C is computed from $R_a$ and $R_e$. The actual liquid flow rate $Q_a$ can be obtained by multiplying $Q_e$ by C. In order to achieve a corrected measured liquid flow rate $Q_c$ equal to the expected liquid flow rate $Q_e$, the liquid injection system must be reset from $Q_e$ to a reset liquid flow rate $Q_r$, where $$Q_r = Q_e/C. \qquad (8)$$

C. In-Situ Liquid Flow Rate Estimation & Verification

The liquid injection system 18, and more specifically the liquid flow meter 60, is pre-calibrated during factory production to an accuracy of within about 10% of the desirable calibration requirements. Using the sonic bypass line 36 in conjunction with the remaining components of the processing system 10 of FIG. 1, the sonic flow methodology is applied to calibrate the liquid injection system 18 and reduce the calibration tolerance from 10% to a much lower preset value.

The application of the sonic flow calibration methodology comprises primarily three stages. In the initialization stage, the expected pressure rise ratio $R_e$ is computed using measurements made with the expected liquid flow rate $Q_e$. The actual pressure rise ratio $R_a$ is then obtained by setting the liquid flow meter 60 to $Q_e$ and used to estimate the correction factor C in the estimation step. In the verification stage, the reset liquid flow rate $Q_r$ is computed and used to reset the liquid flow meter 60 if C deviates from 1 by a percentage greater than the required tolerance. A new $R_a$ is computed based on measurements obtained by resetting the liquid flow meter 60 to $Q_r$ and is used to compute a new correction factor C. If C falls within the required tolerance, the calibration process is completed. If C falls outside the required tolerance, the new correction factor C is used to compute a new reset liquid flow rate $Q_r$ and the verification procedure is repeated until C falls within the required tolerance. Throughout this procedure, the chamber inlet valve 30 and bypass valve 28 are closed and the sonic bypass valve 38 is opened, and the purge inlet valve 74 is closed.

1. Initialization

The initialization process generates a precise liquid flow rate equal to the expected flow rate $Q_e$ of the liquid precursor to the sonic bypass line 36 for measurements. One method of accomplishing the expected flow rate $Q_e$ is to pre-calibrate the liquid flow meter 60, e.g., by bench calibration. In a bench calibration process, a steady flow of a liquid of a known mass is passed through the liquid flow meter 60. The time for the liquid to pass through the liquid flow meter 60 is measured. The expected flow rate is equal to the mass divided by the time measured. The expected flow rate is compared with the measured flow rate shown or displayed on the liquid flow meter 60. If the two flow rates are not equal, the liquid flow meter 60 is adjusted until the displayed flow rate reading is equal to the expected flow rate. The pre-calibrated liquid flow meter 60' is used in the liquid injection system 18 for the initialization procedure and the controller 80 is used to manage the flow circuit of the processing system 10.

The first step of the initialization process is to measure an expected base pressure $P_{e0}$ in the sonic bypass line 36 using the pressure gauge 44 before any gas flows through the sonic bypass line 36. The liquid precursor inlet valve 64 and sonic bypass valve 38 are closed to block the flow of gas. The controller 80 sends a signal to open the sonic bypass valve 38 to release the carrier gas into the sonic bypass line 36. The carrier gas flow rate is chosen to be sufficiently high to cause a sonic flow across the sonic orifice 40. The pressure reading in the pressure gauge 44 will increase from $P_{e0}$. After the flow of carrier gas in the sonic bypass line 36 stabilizes, the pressure reading will reach a stable first expected steady state pressure $P_{e1}$. The controller 80 receives the signal from the pressure gauge 44 and desirably displays the pressure data on a visual display (not shown).

After $P_{e1}$ is recorded, the controller 80 senses the liquid flow rate setting of $Q_e$ of the pre-calibrated liquid flow meter 60' and adjusts the injection control valve 66 accordingly. The controller 80 then opens the liquid precursor inlet valve 64 to release the liquid precursor through the pre-calibrated liquid flow meter 60' and injection control valve 66 to the vaporizer 68, where the liquid precursor is converted into vapor precursor. The vapor precursor joins the carrier gas stream and passes through the sonic bypass line 36. The pressure reading in the pressure gauge 44 will increase from $P_{e1}$ and reaches a stable second steady state pressure $P_{e2}$ after a transient period. The controller 80 receives the signal from the pressure gauge 44 and desirably displays the pressure data on the visual display. The controller 80 records $P_{e2}$ and computes the expected pressure rise ratio $R_e=(P_{e2}-P_{e1})(P_{e1}-P_{e0})$, which corresponds to the expected liquid flow rate $Q_e$.

Figure 3:
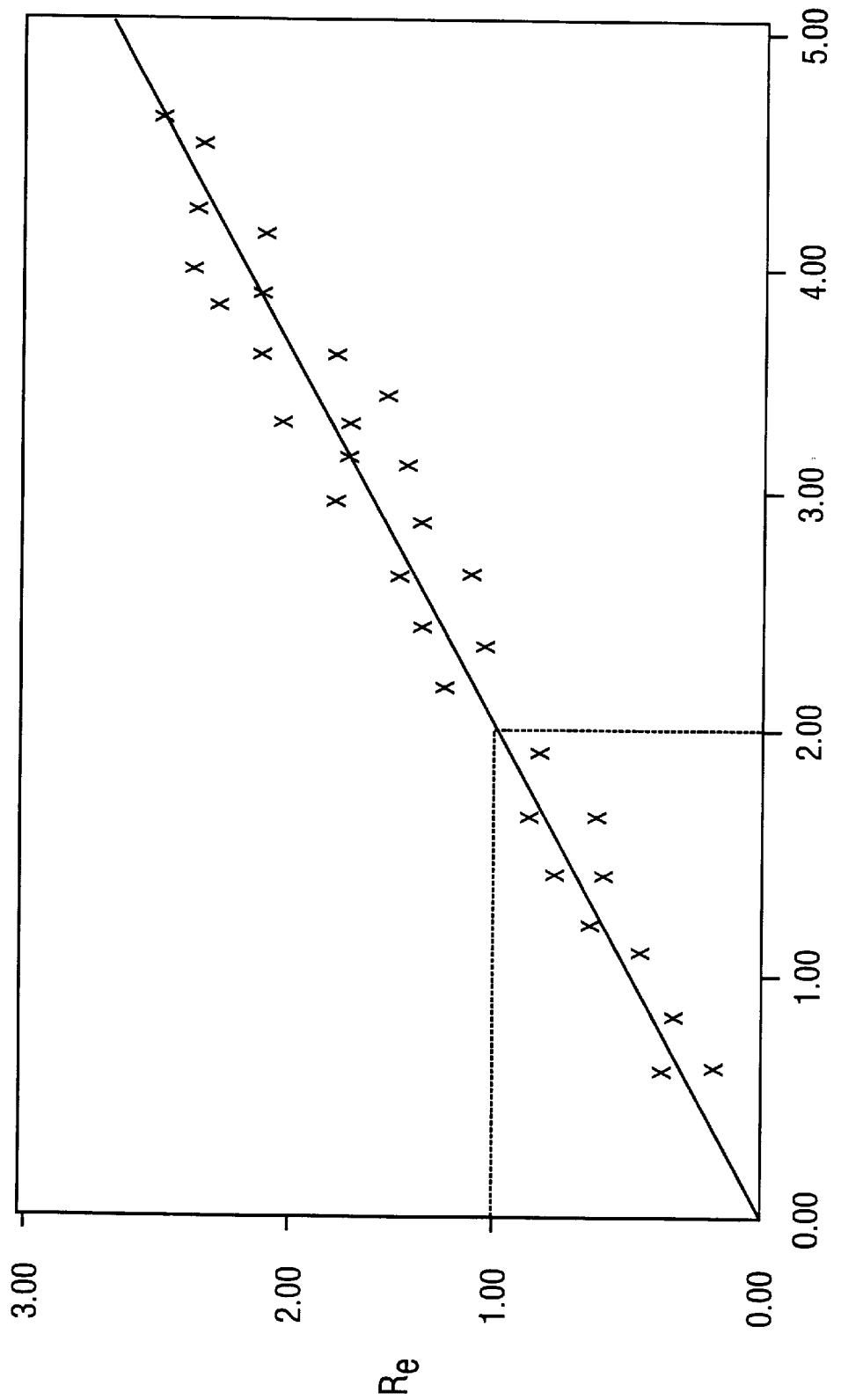
FIG. 3 is an illustrative calibration curve showing the expected pressure rise ratio as a function of the expected liquid precursor flow rate.

Because the operating liquid flow rate of the semiconductor wafer processing system 10 may vary for different processes, it is desirable to obtain the expected pressure rise ratios for a range of expected liquid flow rates. The above initialization process will thus be performed for a range of liquid flow meter settings $Q_e$ to obtain a range of $R_e$ values. An illustrative plot of $Q_e$ versus $R_e$ based on these values is shown in FIG. 3. Theoretically, the relationship between $Q_e$ and $R_e$ is linear, but the empirical experimental values will deviate slightly from linearity. Thus, an estimated linear calibration curve is obtained which can be used for estimation and verification over a wide range of $Q_e$ values, such as the one shown in FIG. 3. For reliability, more than one pre-calibrated liquid flow meter 60' can be used to run the initialization process to obtain additional empirical values of $Q_e$ versus $R_e$ and a calibration curve can be obtained by averaging the various empirical values. Although it is possible to establish a calibration curve based on two sets of empirical values obtained from two experiments, the reliability of such a calibration curve will be lower than that of a calibration curve obtained from a plurality of tests. The calibration curve is desirably stored in the controller 80 in the mathematical form of $R_e=Q_e/K$ where K is the slope of the calibration curve.

2. Estimation

The estimation stage is performed with the actual liquid flow meter 60 with a flow rate setting equal to the expected flow rate $Q_e$. To begin the process, the controller 80 receives a signal from the pressure gauge 44 with the reading of $P_0$ prior to any gas flows to the sonic bypass line 36. For the same system 10, $P_0$ is generally equal to $P_{e0}$. The controller 80 sends a signal to open the sonic bypass valve 38 to release the carrier gas into the sonic bypass line 36. The carrier gas flow rate is chosen to be sufficiently high to cause a sonic flow across the sonic orifice 40. The pressure reading in the pressure gauge 44 will increase from $P_0$ to the first steady state pressure $P_1$ after passing through a transient period and reaching steady state. If the carrier gas and flow rate are chosen to be the same as those for the initialization stage, $P_1$ is generally equal to $P_{e1}$. The controller 80 receives the signal from the pressure gauge 44 and desirably displays the pressure data on the visual display.

The controller 80 senses the liquid flow rate setting of $Q_e$ of the liquid flow meter 60 and adjusts the injection control valve 66 accordingly. The controller 80 then opens the liquid precursor inlet valve 64 to release the liquid precursor through the liquid flow meter 60 and injection control valve 66 to the vaporizer 68, where the liquid precursor is converted into vapor precursor. The vapor precursor joins the carrier gas stream and passes through the sonic bypass line 36. The pressure reading in the pressure gauge 44 will increase from $P_1$ and reaches a second steady state pressure $P_2$ after a transient period. The controller 80 receives the signal from the pressure gauge 44 and desirably displays the pressure data on the visual display. The controller 80 records $P_2$ and computes the actual pressure rise ratio $R_a=(P_2-P_1)/(P_1-P_0)$, which corresponds to an actual liquid flow rate $Q_a$ that is generally different from the expected liquid flow rate $Q_e$ from the liquid flow meter setting due to inaccuracies of the liquid flow meter 60.

The controller 80 takes the two pressure rise ratios $R_e$ and $R_a$ and computes the estimated correction factor $C=R_a/R_e$. $R_e$ may be taken from the actual data obtained in the initialization stage or estimated from the calibration curve of FIG. 3. Alternatively, $R_e$ may be extracted from the mathematical relationship $R_e=Q_e/K$ stored in the controller 80.

3. Verification

If the correction factor C deviates from 1 by a percentage larger than the required tolerance, the controller 80 uses C to compute a reset liquid flow rate $Q_r=Q_e/C$. In that case, the controller 80 sends a signal to the liquid flow meter 60 to adjust the setting from $Q_e$ to $Q_r$. With the reset liquid flow rate $Q_r$, the estimation process is repeated to obtain a new measured pressure rise ratio $R_a$. The new $R_a$ is used to compute a new correction factor C. If C falls within the required tolerance, the calibration of the liquid injection system 18 is completed and the verification is terminated. If C falls outside the required tolerance, C is used to compute a new reset liquid flow rate Qr and the verification process is repeated until C falls within the required tolerance.

To illustrate the in-situ liquid flow rate estimation and verification procedure, an illustrative example is set forth as follows. Assuming an illustrative $R_e$ value of 1.00 for a $Q_e$ value of 2.00 g/min, and that the measured value for $(P_2-P_1)$ is 1.10 and the value for $(P_1-P_0)$ is 1.00, the actual pressure rise ratio $R_a$=1.10. Because $K=Q_e/R_e$=2.00, the actual flow rate $Q_a=KR_a$=2.20 g/min, even though the liquid flow meter 60 is set at 2.00 g/min. Note that the $R_e$ value can also be obtained from the calibration curve of FIG. 3. As a result, the correction factor $C=R_a/R_e$=1.10, and the reset liquid flow rate $Q_r=Q_e/C$=1.82 g/min. After resetting the liquid flow meter 60 from 2.00 g/min to 1.82 g/min, the new actual flow rate $Q_a$ should be approximately equal to $CQ_r$=1.10×1.82 g/min=2.00 g/min, which is the intended liquid flow rate, and the new $R_a$ should be equal to $R_e$ and the new C should be 1.00. If C does not equal to 1.00 or fall sufficiently close to 1.00 with an acceptable tolerance (e.g., 2%) due to system inaccuracies, then the new C is used to compute a new reset liquid flow rate $Q_r$ and the verification process is repeated until C falls within the required tolerance.

It will be understood that the above-described arrangements of apparatus and the methods therefrom are merely illustrative of applications of the principles of this invention and many other embodiments and modifications may be made without departing from the spirit and scope of the invention as defined in the claims.

What is claimed is:

1. An apparatus for in-situ control of the flow of a liquid precursor into a deposition chamber, said apparatus comprising:

a liquid injection system having a liquid precursor supply, a carrier gas supply, a liquid injection outlet, a vaporizer, and a controller managing flows of said liquid precursor and said carrier gas to said liquid injection outlet;

a chamber inlet line upstream of said deposition chamber and connected between said liquid injection outlet and said deposition chamber; and a bypass line connected to said chamber inlet line at a bypass inlet and being downstream of said bypass inlet, said bypass line including a bypass valve, a sonic orifice, and a pressure gauge upstream of said sonic orifice.

2. The apparatus of claim 1, wherein said liquid injection system further comprises a liquid flow meter in communication with said liquid precursor supply and a liquid precursor inlet valve disposed between said liquid flow meter and said liquid precursor supply.

3. The apparatus of claim 2, wherein said liquid injection system further comprises an injection control valve disposed in a line connected between said liquid flow meter and said liquid injection outlet, said carrier gas supply connected to said line at a location downstream of said injection control valve.

4. The apparatus of claim 3, wherein said controller comprises a processor that communicates with said liquid flow meter for receiving flow rate data measured in said liquid flow meter and with said injection control valve for adjusting said injection control valve to produce a flow rate that approximates a preset flow rate selected for said liquid flow meter.

5. The apparatus of claim 4, wherein said processor communicates with said pressure gauge to receive data from said pressure gauge, with said bypass valve to open and close said bypass valve, and said liquid precursor inlet valve to open and close said liquid precursor inlet valve.

6. The apparatus of claim 1, wherein said carrier gas supply is in communication with said vaporizer.

7. The apparatus of claim 1, further comprising a display unit communicating with said pressure gauge to display measurements of said pressure gauge for visual observation.

8. The apparatus of claim 1, wherein said chamber inlet line includes a chamber inlet valve disposed downstream of said bypass inlet.

9. A method for in-situ control of the flow of a liquid precursor using the apparatus of claim 1, comprising the steps of:

directing a flow of carrier gas into said bypass line at a carrier gas sonic flow rate and measuring a first steady state pressure with said pressure gauge;

vaporizing and directing said liquid precursor to said flow of carrier gas into said bypass line and measuring a second steady state pressure with said pressure gauge;

computing calibration information using said first steady state pressure and said second steady state pressure; and calibrating said controller using said calibration information to achieve a target flow rate of said liquid precursor.

10. The method of claim 9, further comprising the step of measuring a base pressure with said pressure gauge prior to directing said flow of said carrier gas into said bypass line, wherein said step of computing calibration information uses said base pressure.

11. The method of claim 10, wherein said step of computing calibration information comprises:

determining a pressure rise ratio, $R=(P_2-P_1)/(P_1-P_0)$, where $P_0$ is said base pressure, $P_1$ is said first steady state pressure, and $P_2$ is said second steady state pressure;

computing a calibration factor C using R; and using said C to generate said calibration information.

12. The method of claim 11, wherein $C=R/R_e$, where $R_e$ is an expected pressure rise ratio for said target flow rate.

13. The method of claim 12, further comprising the step of determining $R_e$ during an initialization procedure that is performed using said bypass line prior to performing the aforementioned steps.

14. The method of claim 13, wherein said step of determining $R_e$ comprises:

measuring a reference base pressure $P_{R0}$ with said pressure gauge;

directing a flow of carrier gas into said bypass line at a reference carrier gas sonic flow rate and measuring a first reference steady state pressure $P_{R1}$ with said pressure gauge;

vaporizing and directing said liquid precursor at said target flow rate to said flow of carrier gas into said bypass line and measuring a second reference steady state pressure $P_{R2}$ with said pressure gauge; and computing $R_e=(P_{R2}-P_{R1})/(P_{R1}-P_{R0})$.

15. The method of claim 10, wherein said step of computing calibration information comprises:

determining a pressure rise ratio, $R=(P_2-P_1)/(P_1-P_0)$, where $P_0$ is said base pressure, $P_1$ is said first steady state pressure, and $P_2$ is said second steady state pressure; and comparing said R to an expected pressure rise ratio $R_e$ for said target flow rate; and said step of calibrating said controller comprises adjusting a mass flow rate setting in said controller specified for said liquid precursor if R deviates from $R_e$ by more than a desired preset threshold amount.

16. The method of claim 9, wherein said step of vaporizing and directing said liquid precursor to said flow of carrier gas into said bypass line comprises:

directing said liquid precursor into said vaporizer;

within said vaporizer, using said flow of carrier gas to vaporize said liquid precursor that is directed into said vaporizer; and directing said vaporized liquid precursor into said bypass line.

17. A method for in-situ control of the flow of a liquid precursor into a deposition process chamber, said method comprising the steps of:

flowing a sonic flow of carrier gas across a high pressure-drop site of a bypass line which is connected to an inlet line to a chamber at a location upstream of said chamber and measuring a first steady state pressure of said bypass line upstream of said high pressure-drop site;

flowing a vaporized liquid precursor into said sonic flow of carrier gas for delivery into said bypass line at a liquid precursor flow rate and measuring a second steady state pressure of said bypass line upstream of said high pressure-drop site;

generating control data from said first steady state pressure and second steady state pressure; and controlling said liquid precursor flow rate to achieve an intended liquid flow rate in response to said control data.

18. The method of claim 17, further comprising the step of measuring a base pressure of said bypass line upstream of said high pressure-drop site prior to flowing said sonic flow of carrier gas into said bypass line, wherein said base pressure is used in said step of generating control data.

19. The method of claim 18, wherein said step of generating control data comprises:

determining a pressure rise ratio, $R=(P_2-P_1)/(P_1-P_0)$, where $P_0$ is said base pressure, $P_1$ is said first steady state pressure, and $P_2$ is said second steady state pressure;

computing a calibration factor C using R; and using said C to generate said control data.

20. The method of claim 19, wherein $C=R/R_e$, where $R_e$ is an expected pressure rise ratio for said intended liquid flow rate.

21. The method of claim 20, wherein said step of controlling said liquid precursor flow rate comprises adjusting a mass flow rate of said liquid precursor if C deviates from 1 by more than a desired preset percentage.

22. The method of claim 20, further comprising the step of determining $R_e$ prior to performing the aforementioned steps, said step of determining $R_e$ comprising:

measuring a reference base pressure $P_{R0}$ with said pressure gauge;

directing a flow of carrier gas into said bypass line at a reference carrier gas sonic flow rate and measuring a first reference steady state pressure $P_{R1}$ with said pressure gauge;

vaporizing and directing said liquid precursor at said intended liquid flow rate to said flow of carrier gas into said bypass line and measuring a second reference steady state pressure $P_{R2}$ with said pressure gauge; and computing $R_e=(P_{R2}-P_{R1})/(P_{R1}-P_{R0})$.

23. The method of claim 22, wherein said step of determining $R_e$ is repeated for a plurality of intended liquid flow rates to generate a plot of $R_e$ as a function of intended liquid flow rate.

24. An apparatus for in-situ control of the flow of a liquid precursor into a vapor deposition chamber, said apparatus comprising:

a chamber inlet line in communication with a vapor deposition chamber;

a bypass line in communication with said chamber inlet line and comprising a sonic restriction and a pressure measurement device upstream of said sonic restriction;

a carrier gas supply in communication with said chamber inlet line and being upstream of said bypass line;

a flow controller for controlling a flow of liquid precursor into said target flow rate at a location downstream of said carrier gas supply and upstream of said bypass line; and a liquid precursor vaporizer.

25. The apparatus of claim 24, wherein said flow controller comprises an injection control valve adjustable to vary a mass flow rate of said flow of liquid precursor into said target flow rate.

26. The apparatus of claim 25, wherein said flow controller comprises a control module communicating with said injection control valve to adjust said mass flow rate.

27. The apparatus of claim 26, wherein said flow controller comprises a liquid flow meter which receives a liquid precursor flow rate setting and measures flow rates of said liquid precursor.

28. The apparatus of claim 27, wherein said control module communicates with said liquid flow meter to receive and use said liquid precursor flow rate setting and said measured flow rate of said liquid precursor for adjusting said injection control valve.

29. The apparatus of claim 27, wherein said control module communicates with said pressure measurement device to receive pressure measurement data and compute a correction factor.

30. The apparatus of claim 29, wherein said control module communicates with said liquid flow meter to modify said liquid precursor flow rate setting using said correction factor.

31. The apparatus of claim 29, wherein said pressure measurement data comprises a base pressure $P_0$, a first steady state pressure $P_1$, and a second steady state pressure $P_2$, said $P_0$ measured prior to directing said flow of carrier gas into said bypass line, said $P_1$ measured by directing a flow of carrier gas into said bypass line at a carrier gas sonic flow rate, and said $P_2$ measured by vaporizing and directing said liquid precursor to said flow of carrier gas into said bypass line with said liquid flow meter set at said liquid precursor flow rate setting.

32. The apparatus of claim 31, wherein said correction factor is $C=R/R_e$, where R is a measured pressure rise ratio and $R=(P_2-P_1)/(P_1-P_0)$, and Re is an expected pressure rise ratio for an actual flow rate of said liquid precursor equal to said liquid precursor flow rate setting.

33. The apparatus of claim 32, wherein said $R_e=(P_{e2}-P_{e1})/(P_{e1}-P_{e0})$, where said $P_{e0}$ is an expected base pressure measured prior to directing any carrier gas into said bypass line, said $P_{e1}$ is a first expected steady state pressure measured by directing a flow of carrier gas into said bypass line at a calibration carrier gas sonic flow rate, and said $P_{e2}$ is a second expected steady state pressure measured by vaporizing and directing said liquid precursor at said actual flow rate to said flow of carrier gas into said bypass line.

* * * * *